US 6,690,922 B1

(12) United States Patent
Lindemann

(10) Patent No.: US 6,690,922 B1
(45) Date of Patent: Feb. 10, 2004

(54) RADIO FREQUENCY (RF) SYSTEM LOSS COMPENSATION METHOD USING POWER MEASUREMENT OF PULSED RF SOURCE

(75) Inventor: Brian Lindemann, Olathe, KS (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/569,235

(22) Filed: May 11, 2000

Related U.S. Application Data

(62) Division of application No. 09/470,636, filed on Dec. 22, 1999.
(60) Provisional application No. 60/134,182, filed on May 13, 1999, and provisional application No. 60/113,758, filed on Dec. 23, 1998.

(51) Int. Cl.$^7$ .............................. H04B 1/00; H04B 7/00; H04Q 7/20
(52) U.S. Cl. ...................... 455/69; 455/522; 455/67.11
(58) Field of Search ......................... 455/67.1, 69, 75, 455/115, 123, 126, 127, 129, 134, 522, 423, 425, 226.1; 324/76.11–76.24

(56) References Cited

U.S. PATENT DOCUMENTS

| | | | | |
|---|---|---|---|---|
| 5,715,526 A | * | 2/1998 | Weaver et al. | 455/126 |
| 5,768,684 A | * | 6/1998 | Grubb et al. | 455/13.4 |
| 5,869,986 A | * | 2/1999 | Haque et al. | 327/61 |
| 5,987,320 A | * | 11/1999 | Bobick | 455/423 |
| 6,046,987 A | * | 4/2000 | Tagawa | 370/252 |
| 6,310,645 B1 | * | 10/2001 | Lapushin et al. | 348/192 |
| 6,480,702 B1 | * | 11/2002 | Sabat, Jr. | 455/115 |

* cited by examiner

Primary Examiner—Nguyen T. Vo
Assistant Examiner—Simon Nguyen

(57) ABSTRACT

A method and circuit for accurately measuring radio frequency power level in a pulsed RF transmission.

38 Claims, 6 Drawing Sheets

RADIO FREQUENCY (RF) SYSTEM LOSS COMPENSATION METHOD USING POWER MEASUREMENT OF PULSED RF SOURCE

This application claims the benefit of U.S. Provisional Application Serial No. 60/134,182, filed in the name of Brian Lindemann on May 13, 1999, the complete disclosure of which is incorporated herein by reference. This application further claims the benefit of and is a division of U.S. patent application Ser. No. 09/470,636, filed in the names of Brian Lindemann and James Joyce on Dec. 22, 1999 which claims the benefit of U.S. Provisional Application Serial No. 60/113,758, filed in the names of Brian Lindemann and James Joyce on Dec. 23, 1998, the complete disclosures of which are incorporated herein by reference.

FIELD OF THE INVENTION

The invention relates to the field of precise measurement of RF power, and in general to the compensation of radio system RF losses, particularly the compensation of radio system RF losses using closed loop gain compensation.

BACKGROUND OF THE INVENTION

In radio installations generally, the amount of radio frequency (RF) energy transmitted at the antenna is desirably held consistent from one installation to another. However, many sources of variation in each device result in significant variations. In ground-based single channel communication, the satellite accounts for variations by transmitting command signals to the ground-based unit to increase or decrease power output during transmission. Multichannel communication system installations for use in mass transportation vehicles, such as commercial air transport aircraft, are more complex.

Multichannel communication systems accept data and voice from various sources onboard a vehicle, encode and modulate this information to appropriate RF carrier frequencies, and transmit these carriers over any of multiple transmission channels to the satellite constellation for relay to the ground. Multichannel satellite communication (SatCom) systems also receive RF signals from the satellite constellation, demodulate these signals, perform the necessary decoding of the encoded messages, and output data or voice for use onboard the vehicle by crew members and passengers. Transceivers in such multichannel mobile satellite communication systems include a main system CPU for performing the actual transmit and receive functions, a radio control subsystem that allocates transmission channels to calls, a high power amplifier for boosting the channel power, a common antenna receiving and transmitting signals, and a low noise amplifier amplifying the RF signal received from a satellite. In multichannel mobile communication systems, such as an aircraft installation, many sources of variation in each installation result in significant installation-to-installation variations. For example, typical aeronautical SatCom system installations divide the system functions into multiple separate modules, including a telecommunications module housing the main system CPU and the radio control subsystem, a high power amplifier module, a low noise amplifier module, and the antenna. One important source of variation is inconsistencies in the equipment manufacture. Another important source of variation is the use of different types and lengths of wiring, usually coaxial cable, to interconnect the various physically separated modules, or components, of the communication unit. Although the various functional modules are interconnected with standardized wires or cables for inter-module control and to connect RF signals, installation-to-installation cable type and length variations produce variations in the amount of RF energy at the antenna.

While the desirability of holding the amount of RF energy transmitted at the antenna consistent from one aircraft installation to another is recognized, the necessary use of different types and lengths of cable in different aircraft installations is overcome only by a universal standard cable type and length. Such a standard cable is necessarily the cable required for the most demanding application. Thus, installation-to-installation consistency would require every aircraft to carry the longest, heaviest coupling cables. However, in aircraft installations, the addition of excess cable length and weight is not desirable. Furthermore, a universal type of cable may not satisfy the requirements of all radio installations. Therefore, the variations must be compensated in another way.

The satellite attempts to account for these and other variations in amount of RF energy transmitted at the antenna by transmitting command signals to the communication unit to increase or decrease power output during transmission. In multichannel aircraft installations, the radio control subsystem of the communication unit dynamically controls the output power for each radio transmission channel. The typical communication unit uses closed loop power control algorithms, such as an automatic gain control circuit, for controlling RF power levels at the antenna. The transmitter communication unit receives transmit power level commands from the network satellite, which are intended to control the amount of power radiated by the antenna. The automatic gain control circuit causes the radio control subsystem to increase or decrease power output on each active radio transmission channel in response to command signals transmitted from the satellite. However, the changes in output power applied by the radio control subsystem are not translated consistently into output power at the antenna because the differing amounts of power absorption by the RF cables interconnecting the various modules results in variations in the coupling losses between the radio control subsystem and the antenna. These variations cannot be compensated by the automatic gain control circuit. Such losses may range anywhere from 0 to 20 dB or more, depending upon the installation.

Thus, even with standardized intermodule wiring, each installation results in different amount of cable loss relative to other similarly wired installations. This variation in RF cable loss presents problems with the closed loop power control algorithms of many second generation satellite systems. The installation-to-installation differences in the amount of RF cable loss causes variations in the amount of RF energy at the antenna. Thus, these installation-to-installation variations in cable loss produce variations in the amount of power radiated by the antenna. Such variable losses in a RF transmission system require an accurate RF power measurement for closed-loop power control.

Manual control of the radiated power variations is impractical. For example, attempting to reduce the installation-to-installation variation by tightly controlling the cable types and cable lengths results in a significantly more difficult installation. Manually measuring power levels and manually adjusting the gain of the high power amplifier until a specified power level is measured also results in a significantly more difficult installation.

Furthermore, in installations where standard cabling is provided, adding a cable for a new purpose, such as determining the output power at the antenna relative to the output power at the transmission channel, is not a practical option. Therefore, the detection and communication of system losses must utilize existing cables. One attempt to resolve the coupling losses between the radio control subsystem and the antenna added a DC bias on the return cable from the antenna to the radio control subsystem. However, the DC bias is subject to the same cable losses as the original signal.

Another difficulty presented by the prior art is actual measurement of the power level during a transmit period of a signal that is modulated with digital data. The nature of digital satellite communications is to transmit in short, unpredictable bursts. This short RF burst transmission causes a typical aeronautical SatCom system to operate normally with a transmission method having a duty cycle of less than 100%, and possibly less than 10%. Accurate measurement of the power level during such short and unpredictable transmit periods cannot be achieved using traditional methods.

Conventional measurement systems use generic power measurement methods. Each measurement systems has drawbacks with respect to the manner in which it reports a RMS (Root Mean Square) value for a given signal. The typical method expects a continuous wave (CW) RF transmission, and the measurement systems is tuned to generate accurate RMS values at a given frequency.

FIG. 1 illustrates a typical Phase Shift Keying (PSK) modulation scheme. The In-phase portion is shown as I, and the Quadrature-phase portion is shown as Q. When I and Q are both zero, no output signal is generated. The I and Q portions are modulated in time to represent bits. There is a transition period Xn between each bit. FIG. 1A illustrates the bit periods in time, denoted by labels A, B, C, D and E, and illustrates intervening transition periods Xn in time, denoted by labels X1, X2, X3, X4, X5, X6. FIG. 1B illustrates the bits using phase representation. In FIG. 1B, a hypothetical 5-bit burst is illustrated using bit periods A, B, C, D and E and transition periods X1, X2, X3, X4, X5, X6. The actual power envelope for this hypothetical example is shown in FIG. 1C. Only the average power per bit is necessary for loss compensation; the power during transition periods Xn is not needed.

The output of typical power measurement devices are shown in FIG. 2A. Traditional power measurement methods are inherently inaccurate due to assumptions made during design of the device. For example, determinations whether to use Peak detection methods, and over which time period to average the power input to determine an RMS voltage from the RF wave input. The various curves shown in FIG. 2A illustrate the power reported by traditional power measurement methods. FIG. 2A illustrates the power reported as a function of time for each of a high speed detector, curve A, reporting the instantaneous power level; a peak detector, curve B, and a "true RMS" detector, curve C, which reports essentially the instantaneous power divided by the square root of 2.

One device disclosed by U.S. Pat. No. 6,046,987, entitled *Instrument For Measuring Leakage Power Leaking To Adjacent Channel*, issued to Tagawa on Apr. 4, 2000, the complete disclosure of which is incorporated herein by reference, attempts to provide channel power measurement for loss compensation in a complex device that measures leakage power appearing in channels adjacent to a main channel when the main channel receives a RF burst signal by using band pass filters to pass the signal components in the frequency bands of the channels adjacent to the main channel, and then measure the power of each signal component which has passed through one of the band pass filters.

What is needed therefore is a means for accurately determining the output power at the antenna during the short, normally unpredictable RF burst transmission periods experienced by wireless telephony. The desired output for loss compensation is shown in curve D of FIG. 2B. The desired output provides actual power during each bit period averaged over the transmission burst period, and reported as "held" during the non-transmitting periods. The system thereby is provided sufficient time in which to respond to fluctuations in the power during which it can adjust the power output for the burst period.

SUMMARY OF THE INVENTION

The present invention overcomes the limitations of the prior art by providing a method and circuit for automatically compensating the installation-to-installation cable loss variation without manual intervention, thereby providing easier and less expensive radio installations. The method and circuit of the invention continually provide precise, accurate RF power measurement. When implemented in a radio communication system, the method and circuit of the present invention provide continuous precise, accurate RF power measurement information allowing continuous precise compensation of the radio system power level variations, resulting in a radio system that is robust to radio system variations, such as variations in gain of the radio system high power amplifier due to manufacturing variations, temperature fluctuations, and other factors affecting cable loss. Furthermore, in a radio frequency communications system using transmission methods having a duty cycle of less than 100%, or even less than 10%, the method and apparatus of the invention provide an accurate measurement of the power during the transmit period that cannot be achieved using traditional methods, by determining when to measure RF power, averaging the measurement across an appropriate time period, and holding the power measurement between measurements. The present invention is used in any radio installation where pulsed RF power measurement is required, such as for closed loop power management.

The method and circuit of the invention precisely and accurately determines the power level difference between a signal source and the antenna transmitting that signal. When implemented in a radio communications system, the method and circuit of the present invention provide means for dynamically adjusting the output power at the antenna of a radio system by determining the power level difference between the signal source and the system antenna, and dynamically adjusting the system gain in response to the detected power level difference.

According to one aspect of the present invention, a method is provided for measuring radio frequency power level in a pulsed RF transmission, the method including determining an appropriate time during a radio frequency transmission period to measure RF power; averaging a value of the RF power level measurement across an appropriate time period; and reporting the average RF power level measurement value as compensation information to the RF signal source. Preferably, the RF power level measurement is used for controlling radio frequency power gains.

According to one aspect of the present invention, the appropriate time to measure RF power level during a transmit period is determined as a function of a priori knowledge of a transmission frame protocol practiced by the radio frequency source, i.e., the transmitter. The a priori knowledge includes knowledge of the modulation scheme and burst timing practiced by the radio frequency transmission system. Determining a time during a transmit period to measure the RF power level also includes determining the peak periods for each of a plurality of bits contained in the RF transmission.

According to another aspect of the present invention, averaging a value of the RF power level measurement includes measuring the RF energy contained in each bit and averaging the measured RF energy. Preferably, the RF energy measurement is accomplished using a Square Root (I*I+Q*Q) formula.

According to another aspect of the present invention, reporting said average RF power level measurement value includes reporting the average power measurement value as constant between individual measurements. Compensation of the RF power level depends upon reporting the average power measurement value to the source generating said RF power.

According to another aspect of the present invention, in a RF transmission system, the RF power level measurement is preferably accomplished at a point in the RF transmission system where any radio frequency power losses between said measurement point and the radio system antenna are essentially constant and known. Preferably, the power level information is reported to the RF source via preexisting receiver cabling within the radio system. Preferably, the reporting structure includes generating a power level information signal indicative of the RF power level measurement and combining the power level information signal with an externally generated radio frequency signal received by the host RF transmission system. The power level information signal is preferably a frequency signal in a frequency range different from the frequency of the radio frequency transmission originated by the host RF transmission system.

According to various other aspects of the invention, the power level information signal is a sinusoidal signal proportional to said radio frequency power level of the radio frequency transmission. Alternatively, the power level information signal is a frequency modulated digital signal having digital information contained in the modulation, the digital information is representative of the average RF power level of the pulse transmission.

According to yet other aspects of the invention, the method of the invention is realized in a electronic circuit adapted for use with a source of a pulsed RF transmission. For example, the circuit of the invention is used to compensate RF power level a RF communications system generating pulsed RF transmissions. In such applications, the circuit of the invention is preferably placed at a position in the transmission line where further RF power losses between the circuit and the system antenna are small relative to other losses in the system and essentially known, such that the further losses appear essentially as a constant off-set in the transmission power.

According to still other aspects of the invention, the method and circuit of the invention are capable of supporting multiple communication channels. In particular, portions of the circuit of the invention are multiplied to support each additional channel, up to a maximum number of channels. Accordingly, the number of down converters and analog-to-digital converters in the circuit is increased by one each for each additional channel operated by the invention, thereby providing power compensation on a channel-by-channel basis.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 1 illustrates a typical Phase Shift Keying (PSK) modulation scheme, wherein

DETAILED DESCRIPTION OF PREFERRED EMBODIMENT

In the Figures, like numerals indicate like elements.

The present invention is a unique power detection method and circuit that allows a radio system transmitting and receiving signals to dynamically and accurately increase and decrease output power. The method and circuit of the invention provide means for measuring the radio frequency (RF) transmission power at the radio system antenna, comparing the antenna power level to the source power level, and dynamically adjusting the system gain to null the net effects of system losses. Accordingly, the invention provides an automatic gain compensation method and circuit for dynamically controlling the gain between a radio system transmitter and antenna using the system RF signal receive and transmit cables to transmit the gain compensation signals by generating gain compensation signals that are sufficiently different in frequency from the transmitted and received RF signals that the gain compensation signals are combined with the transmitted and received RF signals without affecting the transmitted or received RF signals.

The method of the invention includes dynamically determining an RF power level at the system antenna and generating a signal indicative of that antenna RF power level. The antenna power level signal is combined with a received RF signal and transmitted via the system receiver cable to the signal source. The antenna power level signal is of a form such that it does not affect the RF signal received at the system antenna. At the system receiver the received RF transmission signal and the antenna power level signal are split. The received RF transmission signal is applied to the system receiver. The power level signal is compared to the transmitter output power and used to generate a power adjust signal that is transmitted to the system power amplifier via the radio system transmission cable. The power adjust signal is of a form such that it does not affect the RF transmission signal. The power adjust signal dynamically adjusts the antenna power upwardly or downwardly, thereby dynamically adjusting the output power at the radio system antenna using the existing radio system cabling without adversely affecting either transmitted or received RF signals.

An illustrative embodiment of the automatic gain compensation method and circuit of the invention is described herein in terms of a satellite communications system capable of dynamically adjusting the system output power at the antenna responsively to a power adjust signal. The radio thereby automatically compensates for installation dependent cable loss variations. The embodiment illustrated is not intended to in any way limit the scope of the invention. Those of ordinary skill in the art will recognize that dynamic power adjustment method and circuit of the invention may be practiced with other radio systems than those described in the illustration.

Figure 1A:
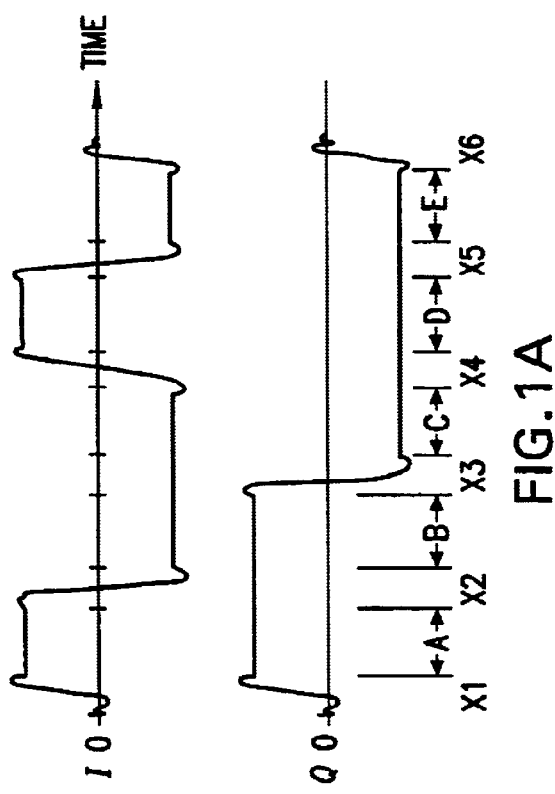
FIG. 1A illustrates the bit periods and intervening transition periods in time.
Figure 1B:
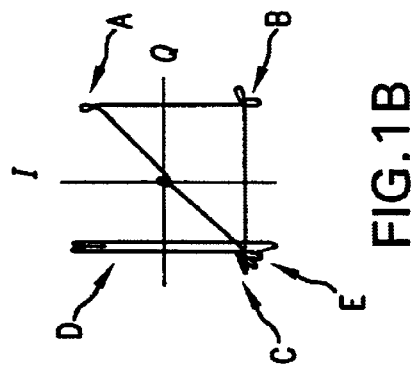
FIG. 1B illustrates a hypothetical 5-bit burst using phase representation.
Figure 1C:
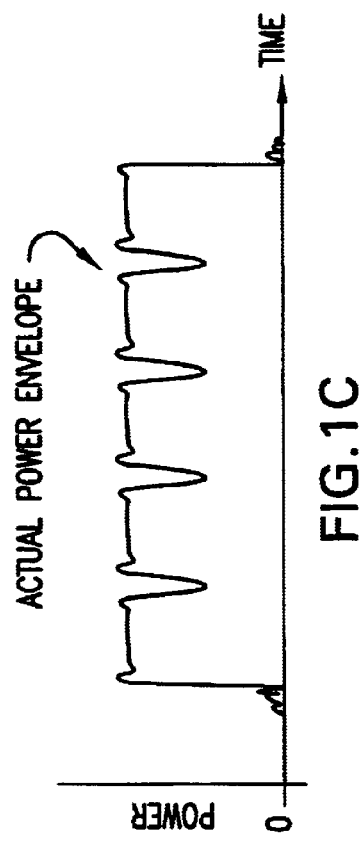
FIG. 1C illustrates the actual power envelope for this hypothetical example.
Figure 2A:
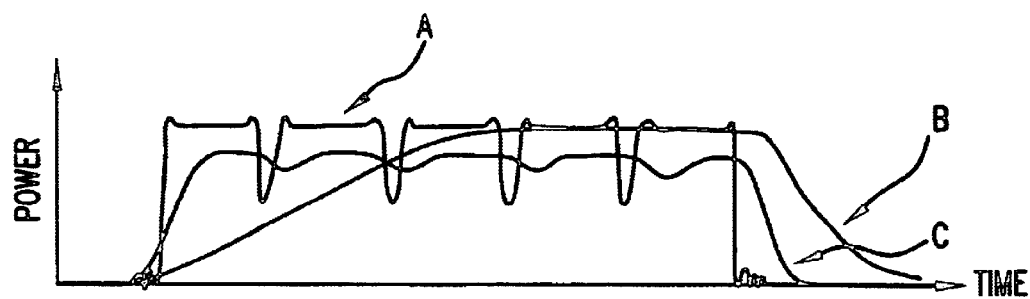
FIG. 2A. illustrates the output of typical power measurement devices as a function of time for each of a high speed detector, a peak detector, and a "true RMS" detector.
Figure 2B:
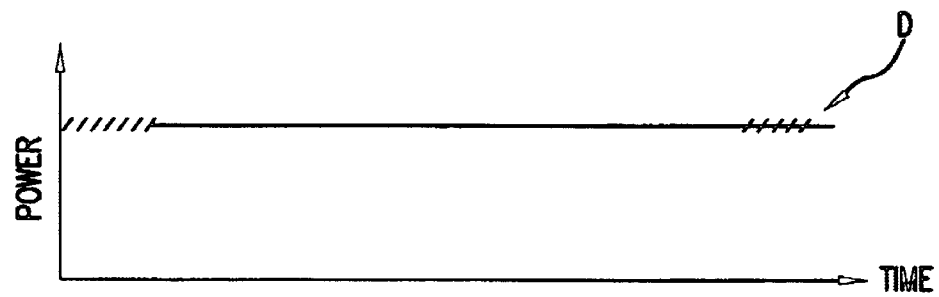
FIG. 2B illustrates the desired output for loss compensation wherein the actual power during each bit period averaged over the transmission burst period and reported as constant or "held" during the non-transmitting periods, thereby providing sufficient time for the power measurement device to respond to fluctuations in the power and adjust the power output for the burst period.
Figure 3:
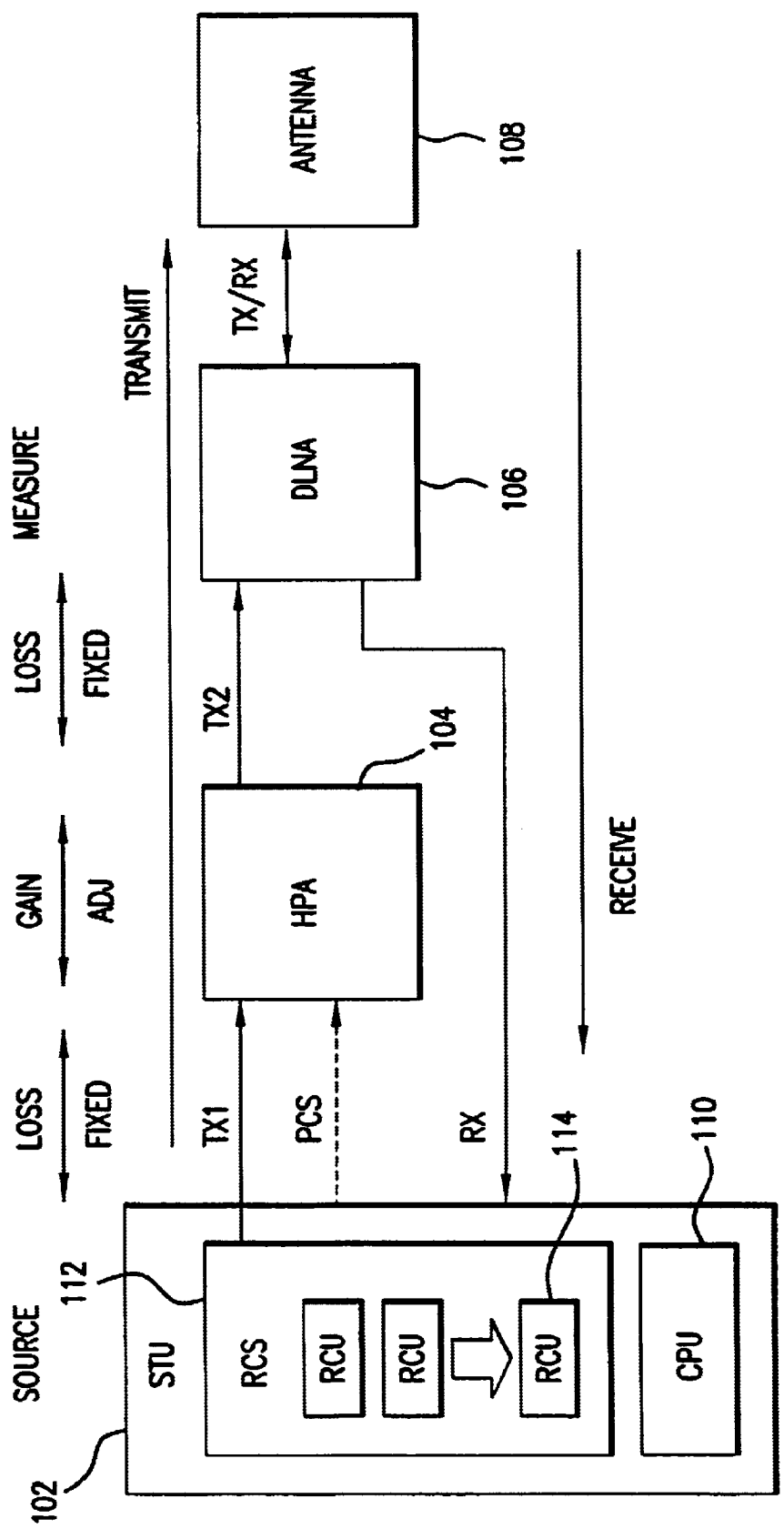
FIG. 3 illustrates a block diagram of the avionics forming a specific implementation of the multichannel communication systems equipment of a satellite communication system (SatCom) operating in the L-Band frequency range, for use in mass transportation vehicles, such as commercial air transport aircraft.

FIG. 3 illustrates a block diagram of the avionics forming a specific implementation of the multichannel mobile communication systems equipment 100 of a satellite communication system operating in the L-Band frequency range, for use in mass transportation vehicles, such as commercial air transport aircraft. Airborne SatCom equipment 100 accepts data and voice input from various sources (not shown) onboard the aircraft, encodes and modulates this information to appropriate RF carrier frequencies, and transmits these RF signals to the satellite constellation for relay to the ground. Avionics equipment 100 also receives RF signals from the satellite constellation, demodulates these RF signals, performs the necessary decoding of the encoded messages, and outputs data or voice for use on-board the vehicle by crew members and passengers.

In FIG. 3, the avionics forming the satellite equipment 100 include, for example, a satellite telecommunications unit (STU) 102, which is essentially a mobile switch, allowing several users, including passengers, flight crew and automated avionics systems, to share the multiple cellular-to-satellite transmission channels. Satellite equipment 100 also includes a high power amplifier (HPA) 104, a diplexer low noise amplifier (DLNA) 106, and a low gain antenna 108. Satellite telecommunications unit 102 includes a main system central processing unit (CPU) 110, which performs the actual transmit power control calculations. Central processing unit 110 is coupled to a radio control subsystem (RCS 112) that allocates the multiple radio channel units (RCU) 114 to incoming and outgoing calls. Radio channel units 114 are modular radio units which handle all the signaling on the L-Band radio frequency link, including for example such standard telephone capabilities as voice mail, call forwarding and worldwide messaging, PC modem data, packet data, and facsimile transmissions. Radio control subsystem 112 is coupled using a length of coaxial cable to separately located high power amplifier 104 for transmitting and receiving communication signals. High power amplifier 104 receives and amplifies the combined transmitter output power of all active radio channel units 110 and transmits the amplified signals to antenna 108 for transmission to a satellite network for communication.

The transmission cable (TX1) coupling radio control subsystem 112 to high power amplifier 104 is of a fixed type and length for any specific aircraft type original equipment manufacturer (OEM) installation, but varies in type and length for installation in different aircraft types and retrofits. Therefore, the power loss over transmission cable TX1 is fixed for a specific installation by its fixed type and length, but the power loss varies from installation-to-installation as the type and length of transmission line TX1 vary. The output of high power amplifier 104 is coupled through diplexer low noise amplifier 106 to antenna 108. The transmission cable (TX2) coupling high power amplifier 104 to diplexer low noise amplifier 106 is also of a fixed type and length for any specific aircraft type OEM installation, but also varies in type and length for installation in different aircraft types and retrofits. Therefore, the power loss over transmission cable TX2 is also fixed for a specific installation by its fixed type and length, but varies from installation-to-installation as the type and length of transmission line TX2 vary. Such losses may range anywhere from 0 to 20 dB or more, depending on the installation.

Diplexer low noise amplifier 106 is coupled to antenna 108 by transmission cable TX/RX, which is essentially constant in type and length from one installation to another such that the power losses over transmission cable TX/RX are essentially fixed from one installation to another. Furthermore, the nature of transmission cable TX/RX is such that the cable loss between diplexer low noise amplifier 106 and antenna 108 is only on the order of 3/10 dB, which is relatively insignificant in comparison to the above described potential cable loss on TX1 and TX2 between radio control subsystem 112 and antenna 108. Diplexer low noise amplifier 106 amplifies the RF signal received from a satellite and transmits the amplified RF signal to satellite telecommunications unit 102. A cavity filter (shown in FIG. 4) includes a circuit that protects sensitive diplexer low noise amplifier 106 from damage during system RF transmissions.

Diplexer low noise amplifier 106 is coupled to radio control subsystem 112 via transmission cable RX, whereby RF transmissions received from the satellite network are received at any of multiple radio channel units 114. According to the invention, the amplified receive RF signal transmitted on transmission cable RX from diplexer low noise amplifier 106 to central processing unit 110 also contains a signal indicative of the actual power at antenna 108. Radio control subsystem 112 responsively generates a power control signal that is transmitted to high power amplifier 104, preferably via transmission cable TX1. In response to the received power control signal, high power amplifier 104 dynamically adjusts the channel power, or gain, on transmission line TX2 for transmission to antenna 108, thereby nulling the variation between the output power at radio control subsystem 112 and the output power at antenna 108. Therefore, the communication unit is able to effectively respond to satellite command signals to increase or decrease power output during transmission.

The present invention is most effectively implemented in a configuration having means to detect the RF power level at the system antenna and compare the detected antenna RF power level with the RF power level at the signal source. Generally, the measure of RF power at the diplexer low noise amplifier 106 accurately indicates the actual RF power at the system antenna, i.e., low gain antenna 108. The cable type and length between diplexer low noise amplifier 106 and low gain antenna 108 is essentially consistent from installation-to-installation, and losses in the cable are relatively insignificant, as described above. Therefore, a measurement of the RF power at diplexer low noise amplifier 106 provides a highly repeatable measure of the RF power at low gain antenna 108. Furthermore, the power loss between diplexer low noise amplifier 106 and low gain antenna 108 is relatively constant and is accounted for using a constant power offset.

Figure 4:
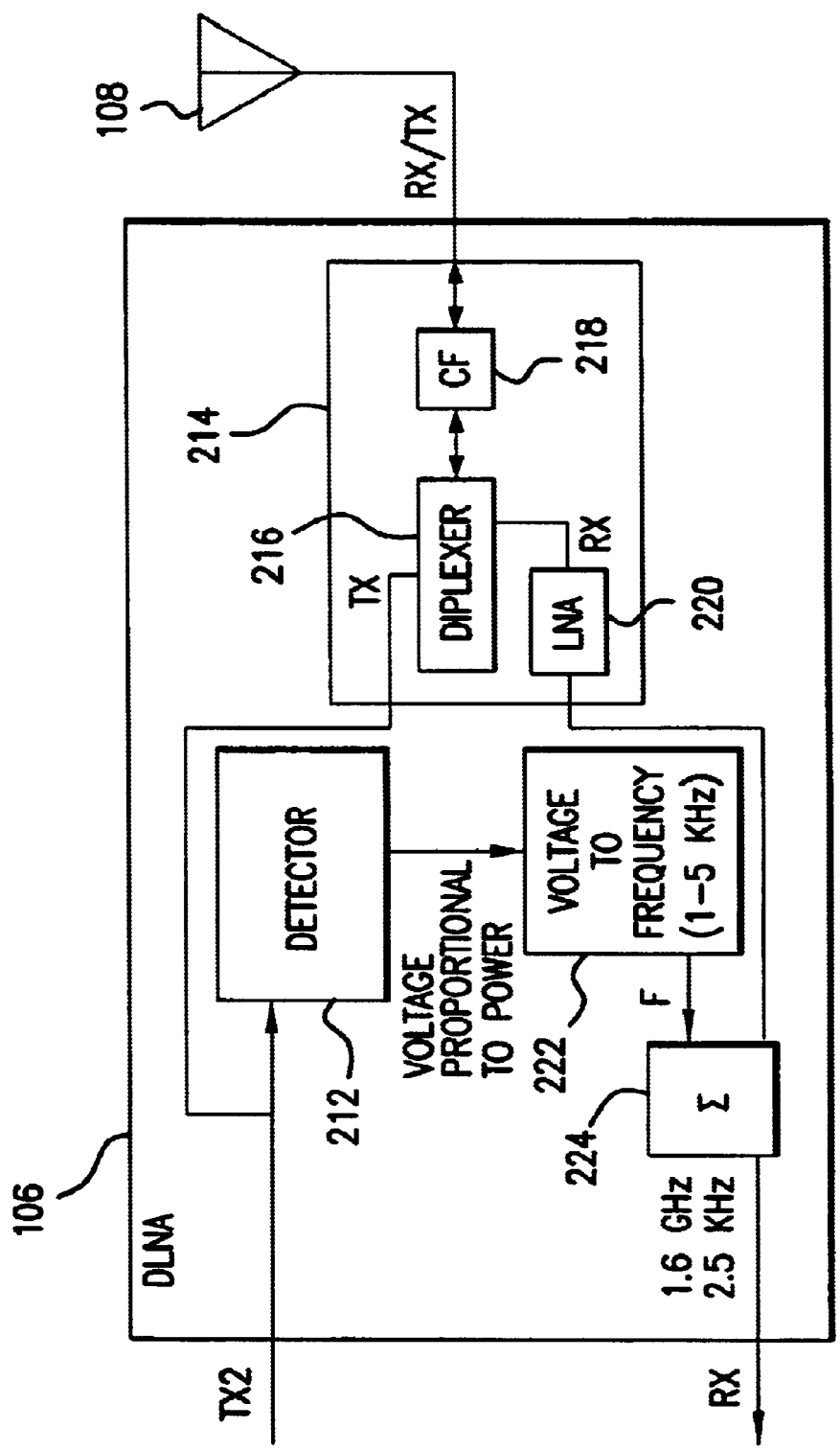
FIG. 4 is a block diagram of diplexer low noise amplifier and antenna, including the RF power level detector of the invention, for receiving the RF transmission signal from a transmitter via a transmission cable, which is usually a coaxial cable.

FIG. 4 is a block diagram of diplexer low noise amplifier 106, including the RF power level detector of the invention. In FIG. 4, diplexer low noise amplifier 106 receives a RF transmission signal from high power amplifier 104 via transmission cable TX2, which is preferably a coaxial cable. The RF transmission signal is applied to a detector 212 for detecting the RF power level of the signal. Detector circuit 212 detects the RF signal power level and generates a voltage "Vout" that corresponds directly to the detected signal power level. Detector 212 is any known RF power level detector. For example, detector 212 may be a 20 dB directional coupler with a detector providing a signal representative of the radio system output voltage "Vout" at the coupler in proportion to the RF output power "Pout" passing through the coupler, or:

$$Vout \propto Pout.$$

The RF transmission signal is simultaneously applied to a diplexer/filter circuit 214 for transmission to system antenna 108. Diplexer/filter circuit 214 typically includes diplexer 216, a cavity filter circuit 218 that isolates the transmit path from the receive path during the transmit mode to prevent damage to sensitive diplexer low noise amplifier 106, and a low noise amplifier circuit 220. The detector signal from detector 212 is applied to a converter 222, which converts the detector signal into a frequency signal "F."

The frequency of frequency signal F has a direct correlation to output voltage Vout as output voltage Vout has a direct correlation to the detected power level. Therefore, the frequency of frequency signal F is directly correlated to the RF power level detected at diplexer low noise amplifier 106. As the output voltage Vout of detector 212 varies, converter 222 varies frequency signal F to represent Vout of detector 212. Frequency signal F is thereby used to communicate the transmit signal power level entering diplexer low noise amplifier 106 from high power amplifier 104 to satellite telecommunication unit 102. Frequency signal F is varied in such a way that the cable losses from the diplexer low noise amplifier 106 to satellite telecommunication unit 102 do not contribute to ambiguous decoding of the transmit level.

Frequency signal F is provided either as an analog or a digital representation of the output voltage Vout of detector 212. According to one embodiment of the invention, frequency signal F is a sinusoidal signal with a frequency proportional to the magnitude of output voltage "Vout" of detector 212, or:

$$F \propto Vout.$$

That is, the frequency of signal F changes as the voltage from the detector 212 changes, such that decoding the frequency of signal F provides the actual output voltage from detector 212. Preferably, frequency signal F is implemented as a sine wave having a frequency range far removed from the operating frequency of the radio system. For example, in a satellite communications system implementation of the present invention, the received RF signal is in the L-Band, or 1.6 GHz frequency range, while proportional frequency signal F is preferably in the range of about 1 to 5 kHz.

In another embodiment of the invention, the output voltage "Vout" from detector 212 is converted to a digital representation, and frequency signal F is a frequency modulated signal with the digital information contained in the modulation. The modulation of frequency signal F is decoded, and the actual value of the voltage at detector 212 is computed.

Frequency signal F and a RF signal received from the satellite constellation are summed in a summing circuit 224 and transmitted to the radio system RF transmission signal source on single coaxial receiver cable (RX). At the radio system signal source, frequency signal F and the RF signal received from the satellite constellation are split. The received RF signal is applied to the radio system receiver. The frequency signal F is used to generate a power control signal, which is applied to the system power amplifier to dynamically adjust the transmission power in response to the applied power control signal.

Figure 5:
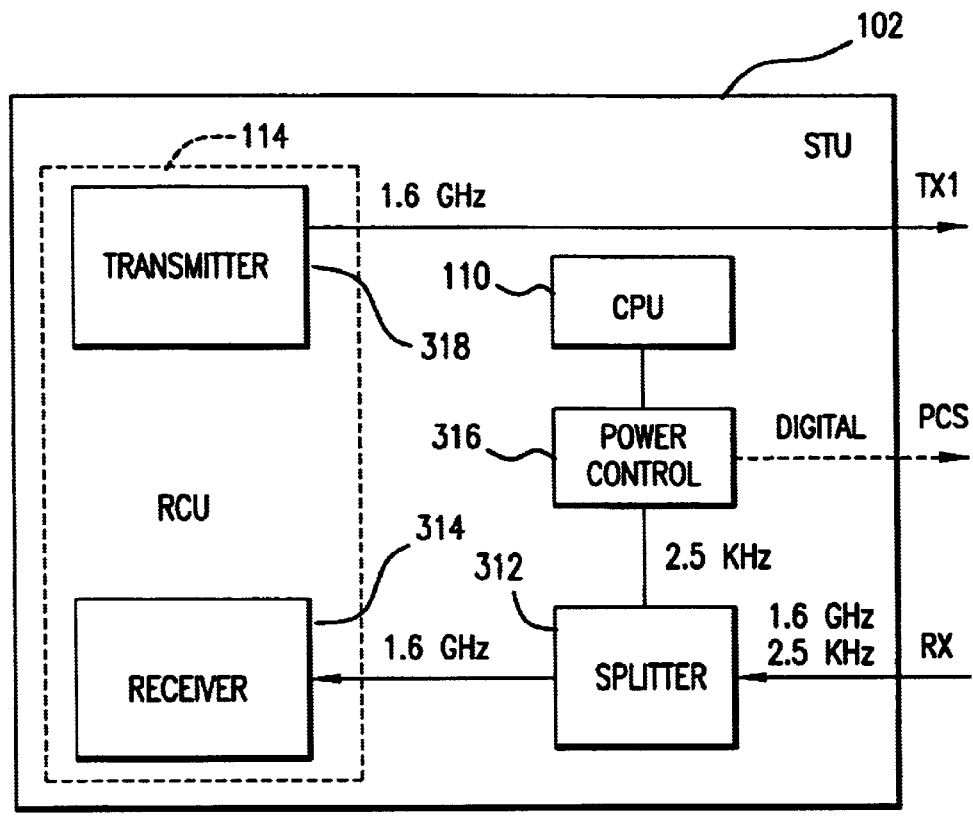
FIG. 5 illustrates the portion of the power control portion of the method and circuit of the invention as implemented in a satellite communication system.

FIG. 5 illustrates the power, or gain, control portion of the method and circuit of the invention as implemented in a satellite communications system. In FIG. 5, the output of diplexer low noise amplifier 106 is received on a single receiver cable RX at a signal splitter circuit 312. Signal splitter circuit 312 divides the combined signal on receiver cable RX into its component parts: the RF signal received from the satellite constellation and frequency signal F. The RF portion of the received signal is output to the radio system transmission signal source, one or more of the individual radio channel units 114, shown in FIG. 3. A system receiver 314 within individual radio channel unit 114 receives the RF portion of the received signal. The frequency signal F portion is output to a power control circuit 316. Splitter circuit 312 receives the combined frequency signal F and the received RF signal summed in summing circuit 224 and transmitted from diplexer low noise amplifier 106 via receiver cable RX. Splitter circuit 312 filters the combined signal using standard high pass and low pass filtering techniques to separate the received 1.6 GHz RF signal and the lower 1 to 5 kHz frequency signal F. The received 1.6 GHz RF signal is output to radio system receiver 314, and the 1 to 5 kHz frequency signal F is sent to power control circuit 316.

Power controller 316 receives frequency signal F and converts it to digital form. In an embodiment where frequency signal F is an analog sine wave, power controller 316 uses a well-known method such as zero-crossing timer to convert analog frequency signal F to a digital number representing the frequency. In an embodiment where frequency signal F is a digital signal, power controller 316 demodulates frequency signal F to convert to baseband digital.

Power controller 316 includes a mechanism that determines the RF power output by the one or more radio system transmitters 318. According to one embodiment, power controller 316 receives transmit power information from each transmitter 318, preferably in digital form. According to another embodiment, power controller 316 detects the power level of the transmitted 1.6 GHz signal by tapping into the TX1 transmission line and applying the signal to an RF power detector. Power controller 316 receives the power level of each transmitter 318 as an input, compares the output power level measured at detector 212 of diplexer low noise amplifier 106 to a predetermined power level, and generates a power control signal "PCS" containing gain compensation commands.

As described above, central processing unit 110 performs the actual transmit power control calculations; therefore, central processing unit 110 contains the transmit power level of each radio channel unit 114. According to an alternative embodiment, central processing unit 110 learns the digital word corresponding to frequency signal F. For example, either power controller 316 transmits the digital word to central processing unit 110, or central processing unit 110 retrieves the digital word from power controller 316. Central processing unit 110 compares the transmit power level of radio channel unit 114 with either the power level detected at diplexer low noise amplifier 106, or the actual power level detected at antenna 108. Central processing unit 110 calculates a compensation signal and send the compensation signal to power control unit 316. Power controller 316 receives the compensation signal as an input and responsively generates a power control signal "PCS" containing gain compensation commands.

Power controller 316 sends power control signal PCS containing gain compensation commands to high power amplifier 104 to bring output power level at diplexer low noise amplifier 106 closer to the predetermined power level. Power controller 316 sends commands to high power amplifier 104 in serial digital form over a dedicated "PCS" line. Alternatively, power controller 316 sends commands to high power amplifier 104 over the TX1 transmission line, using techniques similar to those used to send frequency signals F over the RX receiver line, as described in detail above. Thus, power control signal PCS is carried on radio system transmission line TX1 along with a RF transmission signal, without corrupting or distorting the information in the RF transmission signal. The system power amplifier, high power amplifier 104, is designed to dynamically adjust the transmission power, or gain, in response to received power control signal PCS.

Although the automatic gain compensation circuit of the invention is described herein in combination with the radio system low noise amplifier, diplexer low noise amplifier 106, the invention is alternatively configured in a separate circuit. The automatic gain compensation circuit of the invention effectively compensates for variations in cable losses when the circuit determines the signal power level at the radio system antenna, transmits a signal representative of the signal power level at the radio system antenna a power control circuit 316 using the preexisting radio system receiver cable, compares the power at the radio system antenna with the power level of the transmitted signal at the signal source, and generates a power control signal that is transmitted to the radio system power amplifier, high power amplifier 104, whereby the signal power level is adjusted upwardly or downwardly to compensate for power losses in the transmission cables. Therefore, the automatic gain compensation circuit of the invention is effective when configured separately from diplexer low noise amplifier 106. The automatic gain compensation circuit of the invention need only be coupled to detect a signal indicative of the actual signal power level received at antenna 108 and coupled to transmit a signal indicative of the actual power level via the radio system receiver line coupling the antenna to the signal source. Such a configuration of the automatic gain compensation circuit of the invention is within the contemplation and scope of the present invention.

Furthermore, in the embodiment described in the FIGURES, the detector portion of the automatic gain compensation circuit is coupled to the transmit/receive line RX/TX coupling diplexer low noise amplifier 106 to antenna 108, whereby a signal power level representative of the actual power at the antenna is detected. According to the embodiments of the FIGURES, the power loss between diplexer low noise amplifier 106 and antenna 108 is a fixed and known quantity such that the power level detected at diplexer low noise amplifier 106 sufficiently represents the actual output power level at antenna 108 to effectuate the automatic gain compensation circuit of the invention. Alternatively, the output power level of antenna 108 is measured directly at antenna 108, whereby the actual output power level is known directly and the constant loss across transmit/receive line RX/TX need not be considered. Such a configuration of the automatic gain compensation circuit of the invention is within the contemplation and scope of the present invention.

Thus, the method and circuit of the present invention provide automatic gain compensation in the form of a feedback loop for determining the power level difference between the system signal source and the system antenna, and dynamically adjusting the output power at the system antenna in response to a command from the system control circuit. The gain compensation signals are transmitted within the radio system over the system transmit and receive cables simultaneously with the transmitted and received RF signals. When implemented in a satellite communication system, the present invention provides a method and circuit for dynamically adjusting the system output power in response to a command from satellite telecommunication unit 102 by dynamically adjusting the power gain of high power amplifier 104. Such a configuration of the automatic gain compensation circuit of the invention is within the contemplation and scope of the present invention.

Measuring Pulsed RF Power Utilizing A Priori Knowledge Of The Power Envelope

As noted above, a very accurate and precise measurement of Radio Frequency (RF) power is required to provide closed-loop power control in a variably "lossy" RF transmission system. Conventional power measurement systems expect a continuous wave (CW) RF transmission, and may be tuned to generate accurate RMS values at a given frequency. However, in a system where an instantaneous power measurement of a signal which is modulated with digital data, and has a transmit duty cycle of less than 100%, and possibly even less than 10%, traditional methods cannot accurately measure the power.

Figure 6:
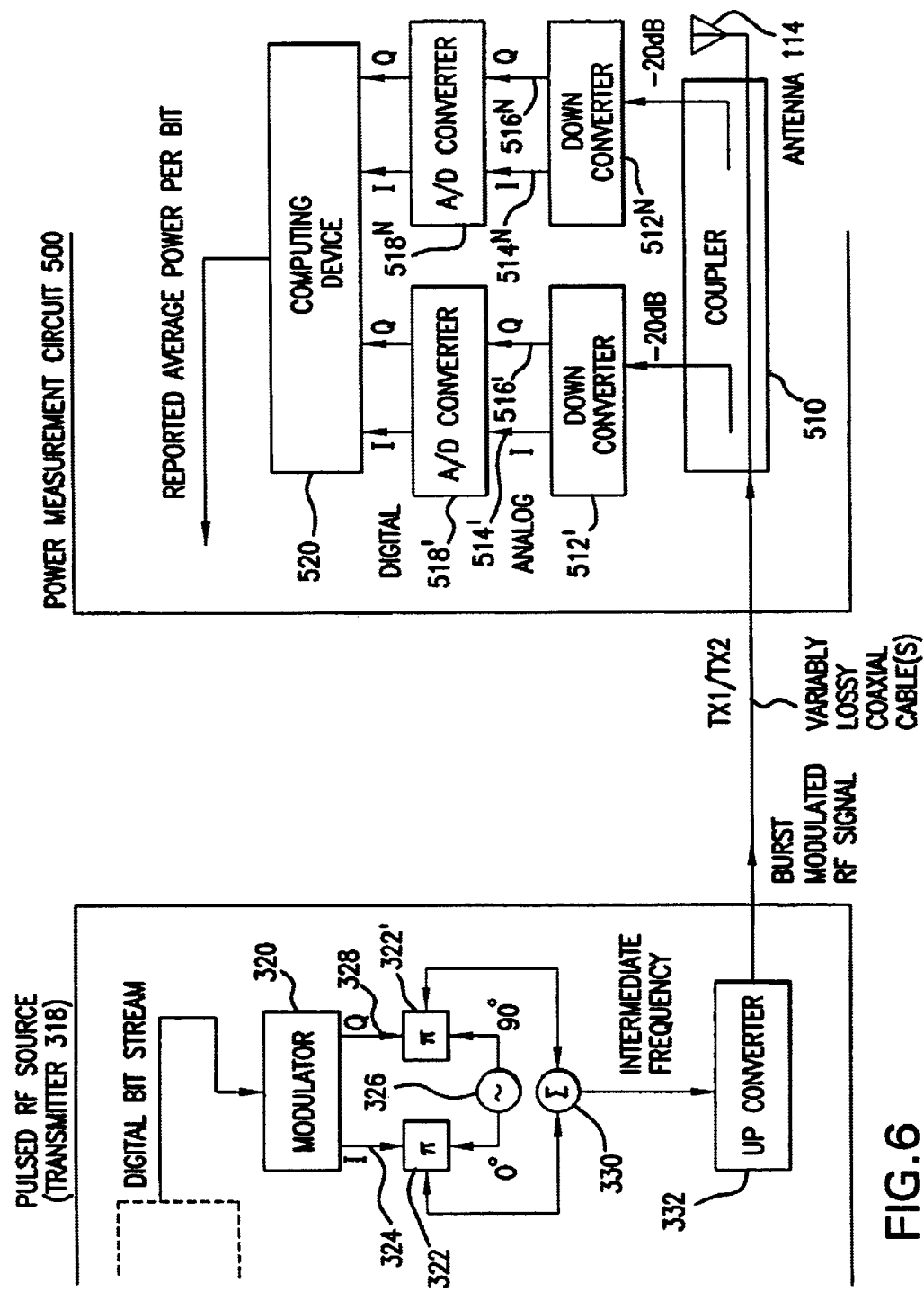
FIG. 6 illustrates a typical pulsed RF source, or transmitter and one embodiment of the RF power measurement circuit of the current invention.

FIG. 6 illustrates a typical pulsed RF source, or transmitter 318, of a type well known in the art having a transmit duty cycle of less than 100%, sometimes less than 10%. Such pulsed RF transmitters are used in multichannel communication systems, and in particular multichannel satellite communication (SatCom) systems, of the type described herein that accept data and voice from various sources onboard a vehicle, encode and modulate this information to appropriate RF carrier frequencies, and transmit these carriers over any of multiple transmission channels to the satellite constellation for relay to the ground. In FIG. 6, the data or voice information is typically received into transmitter 318 as a digital bit stream. Transmitter 318 generates a modulated pulsed RF signal from the digital bit stream for transmission via antenna 108. Within transmitter 318 the digital bit stream is passed into a modulator 320, which converts it into In-phase and Quadrature-phase (I and Q) complex signals in accordance with the modulation scheme used by the communications system. The signals at I and Q are modulated to generate a phase representation of a digital bit stream, and are only active for the transmit time. The I signal is applied to a multiplier 322 that multiplies the I signal 324 by a signal from a sinusoidal signal source, oscillator 326, which is at 0 degrees phase shift relative to the transmit signal.

Multiplier 322' multiplies the Q signal 328 by a signal from sinusoidal signal source 326, which is at 90 degrees phase shift relative to the transmit signal. These two components, 0 degree phase-shifted I signal and 90 degree phase-shifted Q signal, are combined at summing circuit 330, wherein the signals at I and Q are modulated to generate a phase representation of a digital bit stream that is only active for the transmit time. The intermediate frequency (IF) output of summing circuit 330 is passed into an up-converter 332 for conversion to the higher RF frequency used by the communications system. The actual configuration of pulsed RF source 318 varies between applications, but as is understood by those of ordinary skill in the art of phase shift modulation, many different configurations function similarly on the digital bit stream input to generate a digitally modulated pulsed RF signal in a burst for transmission via the system antenna.

Figure 7:
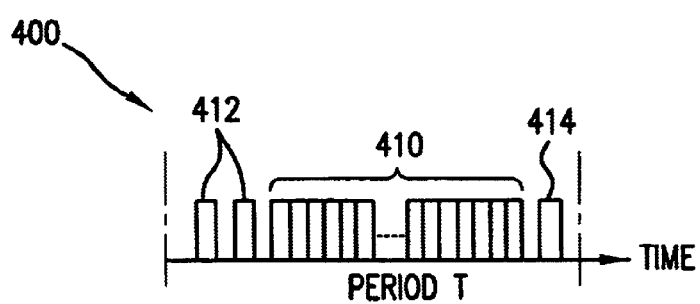
FIG. 7 illustrates one typical configuration of a modulation scheme used by communications system.

FIG. 7 illustrates one typical configuration of a modulation scheme used by communications systems. FIG. 7 illustrates a single transmission frame 400 containing the digital bit information 410 to be transmitted during a single burst. Transmission frame 400 further contains one or more synchronization or "framing" pulses 412, which act as triggers to notify the system of the beginning of bit period T. The information to be transmitted during the pulse follows the final framing pulse by a fixed period of time T, for example, a delay of 1 microsecond. Another one or more framing pulses 414 optionally follows the data to signal completion of the bit period. According to another configuration (not shown) of the modulation scheme used by communications systems, the transmission burst rather includes a preamble, which is a predetermined series of bits transmitted prior to the payload.

FIG. 6 further illustrates one embodiment of the current invention, which solves the problem of measuring the power in a signal which is modulated with digital data and transmitted at a minimal transmit duty cycle with sufficient accuracy to perform closed-loop power control in a variably "lossy" RF transmission system. The invention utilizes an RF power measurement circuit 500 having a priori knowledge of the modulation method and burst timing employed at the transmitter. RF power measurement circuit 500 of the invention is one preferred embodiment of detector 212 for detecting the RF signal power level at the antenna, as described above and shown in FIG. 4. RF power measurement circuit 500 of the invention determines the instantaneous power level per bit (Eb) of the current transmission window and averages power across that transmission window, without including non-transmission RF levels in the calculation. The accurately measured value of the average power across the current transmission window, i.e., the averaged Eb, is communicated to the transmitter for power level compensation.

The modulated signal passes through a variably lossy coaxial transmission cable, for example, TX1 between radio control subsystem 112 and high power amplifier 104 and/or TX2 between high power amplifier 104 and diplexer low noise amplifier 106 (both shown in FIG. 3). Preferably, a power measurement device of this invention is installed "close" to the antenna, "close" being defined relative to overall system RF power loss, as described above. The invention thus being in position to most effectively compensate for the loss due to the coaxial cable and other portions of the system.

RF power measurement device 500 includes an RF coupler 510 coupled to variably "lossy" transmission line TX1/TX2 to accept the burst transmission by a pulsed RF source of a digitally modulated pulsed RF signal. RF coupler 510 is preferably a −20 dB directional coupler. The output of RF coupler 510 is a small portion of the RF energy received from the pulsed RF source, the majority of the received RF energy is passed through to system antenna 114 for transmission. Preferably, the output of coupler 510 is on the order of about 1% of the received RF energy, while the portion passed through to antenna 114 is the majority, or about 99%, of the received RF energy. The output of coupler 510 is passed to a down-converter 512, which generates a baseband output. This baseband is typically the analog In-phase 514 and Quadrature-phase 516 (I and Q) levels corresponding to the modulation scheme employed by the system. I signal 514 and Q signal 516 are proportional to I signal 324 and Q signal 328, respectively, at the source, i.e., transmitter 318. These analog signals, which are inherently at a frequency lower than the RF transmission frequency, are converted to digital representations by Analog-to-Digital (A/D) converter 518.

Computing device 520 utilizes knowledge of the system modulation scheme and burst timing to determine the peak periods for each bit and the energy per bit, as represented on I signal 514 and Q signal 516. Computing device 520 includes knowledge of the transmission frame protocol, i.e., the modulation scheme and burst timing operated by the transmission system. For example, the transmission protocol information is pre-programmed in a non-volatile memory module, such as an EPROM (erasable programmable read-only memory chip) or another suitable device. The frame protocol includes: (1) a description of the synchronization or "framing" pulse or pulses 412, which provide knowledge of the burst timing or when a transmit burst is to occur; (2) the delay to the beginning of the data; and (3) the length T of the bit period and/or a description of framing pulse 414 signaling completion of the bit period (shown in FIG. 7).

Furthermore, the frequency of the transmission burst may change from burst-to-burst. Therefore, computing device 520 further requires a priori knowledge of the burst frequency operated by the transmission system. Although transmission frequency is a component of the transmission protocol information, the changing nature of the transmission frequency prohibits pre-programming this information. Rather, the transmission source, i.e., transmitter 318, communicates the frequency of a given burst to the power measurement circuit prior to the burst occurring. Down converter 512 is responsively tuned to the correct frequency for decoding the bits. According to one embodiment of the invention, the transmission burst frequency information is communicated via the transmission cable, i.e., TX1/TX2. For example, the burst frequency information is communicated in digital format using a method similar to the above described method for communicating the determined power level to the transmission source, transmitter 318, on receiver line RX. The transmission burst information must precede the transmission by a long enough time period to allow the down converter 512 to be responsively tuned to the correct frequency. Assuming a typical 90 milliseconds between transmission bursts with the channel number being one of 333 channels and communication of 16 bits of information describing burst frequency, an 800 bits per second transmission rate is quite suitable. Thus:

16 bits/800 bits/second=20 milliseconds.

Accordingly, one embodiment of the invention provides communication of the transmission burst frequency information beginning about 90 milliseconds before the transmission, leaving 70 milliseconds from receipt of the frequency information until start of the transmission burst for the power measurement circuit 500 to tune down converter 512 to the current transmission frequency. Those of ordinary skill in the art will recognize that a longer or shorter period than the abovementioned 90 milliseconds is possible between transmission bursts, and implement adjustments to receive the burst frequency information and tune down converter 512 within the time available.

Computing device 520 is therefore able to determine the period when a transmit burst is to occur, and the bit periods during that burst. Down converter 512 is responsively tuned to the correct burst frequency, An instantaneous power level is measured for each bit during a burst. Typically the instantaneous power level is determined using a Square Root (I*I+Q*Q) formula. Instantaneous power measurement is obtained for each bit during the transmit burst and averaged across the burst. The instantaneous power level for each bit and the averaged value of all bit power levels for the burst are both reported back to the transmitting device.

A transmission frequency of 4800 bits/second on the transmission line TX1/TX2 is also quite realistic. Accordingly, based on the above described 20 millisecond period preceding the transmission burst for communicating the burst frequency information to the power measurement device of the invention, the invention is realistically able to optionally operate up to a 6 channel system. Operation of such a multichannel system requires multiple down converters 512' through 512$^N$ and corresponding multiple A/D converters 518' through 518$^N$, which operate on the transmitted signal as described above to provide power compensation on a channel-by-channel basis. Those of ordinary skill in the art will recognize that multiple channels in excess of the above described 6 channels are possible in a system in which the frequency tuning information is passed from the transmission source, i.e., transmitter 318, to power measurement circuit 500 at a rate of 4800 bits per second.

While the preferred embodiment of the invention has been illustrated and described, it will be appreciated that various changes can be made therein without departing from the spirit and scope of the invention. For example, rather than pre-programming or storing the a priori knowledge of the transmission frame protocol in a memory module, such information is optionally provided for each transmission pulse along with the transmission burst frequency information at a time immediately prior to the corresponding transmission burst. Accordingly, information describing the modulation scheme and burst timing operated by the transmission system is communicated via the transmission cable prior to the transmission burst.

What is claimed is:

1. A method for measuring radio frequency power level in a pulsed radio frequency (RF) transmission, the method comprising:

determining a time during a RF transmission period to measure RF power, including determining said time to measure RF power level as a function of a priori knowledge of a transmission frame protocol practiced by the RF transmission source and determining the peak periods for each of a plurality of bits contained in the RF transmission:

averaging a value of said RF power level measurement across an appropriate time period; and reporting said average RF power level measurement value.

2. The method recited in claim 1, wherein said a priori knowledge of a transmission frame protocol further comprises a priori knowledge of a modulation scheme, burst timing practiced by the RF transmission system, and transmission burst frequency.

3. The method recited in claim 1, wherein said averaging a value of said RF power level measurement further comprises measuring the RF energy contained in each said bit and averaging said RF energy.

4. The method recited in claim 3, wherein measuring said RF energy contained in each said bit further comprises computing an instantaneous power level for each said bit using a Square Root (I*I+Q*Q) formula.

5. The method recited in claim 3, wherein said reporting said average RF power level measurement value further comprises reporting said average power measurement value as constant between measurements.

6. The method recited in claim 5, wherein said reporting said average power measurement value further comprises reporting said average power measurement value to the source generating said RF power.

7. The method recited in claim 6, wherein said RF power level measurement further comprises measuring the RF power of a transmission signal at a measurement point in the RF transmission system where any RF power losses between said measurement point and the radio transmission system antenna are essentially predetermined.

8. The method recited in claim 7, wherein said reporting further comprises communicating said RF power level via preexisting receiver cabling within the radio system.

9. The method recited in claim 8, wherein said reporting further comprises:

generating a signal indicative of said RF power level measurement and combining said signal indicative of RF power level measurement with a RF signal originating externally to the radio transmission system and received thereby.

10. The method recited in claim 9, wherein said signal indicative of RF power level measurement further comprises a frequency signal in a frequency range different from the frequency of the RF transmission originated by the radio transmission system.

11. The method recited in claim 10, wherein said reporting further comprises generating a sinusoidal signal proportional to said RF power level of the RF transmission.

12. The method recited in claim 10, wherein said reporting further comprises generating a frequency modulated digital signal having digital information contained in the modulation, said digital information representative of the RF power level of the RF transmission.

13. The method recited in claim 10, further comprising utilizing said RF power level measurement for controlling RF power gains.

14. A method for using an electronic circuit to measure radio frequency power level in a radio frequency (RF) transmission system using transmission methods having a duty cycle of less than 100%, the method comprising:

a) tuning the electric circuit to the frequency of the transmission;

b) recalling stored information describing a transmission frame protocol utilized by the RF transmission system;

c) with the electronic circuit, determining as a function of said protocol points during a RF transmission period at which to start and stop measuring RF transmission power level;

d) with the electronic circuit, measuring said RF transmission power level by:

i) determining a peak period for each of a plurality of bits contained in the RF transmission between said start and stop points, ii) determining a value of the RF energy contained in each said bit, and iii) determining an average of said values of RF energy; and e) with the electronic circuit, generating a signal representative of said RF transmission power level.

15. The method recited in claim 14, wherein said determining a value of the RF energy contained in each said bit further comprises determining an instantaneous power level per bit.

16. The method recited in claim 14, wherein said determining a value of the RF energy contained in each said bit further comprises determining said instantaneous power level per bit only during RF transmission.

17. The method recited in claim 16, wherein said determining an average of said values of RF energy further comprises assigning a constant value to said values of RF energy during periods between incidents of said determining a value of the RF energy contained in each said bit.

18. An electronic circuit for determining the radio frequency power level in a pulsed radio frequency (RF) transmission, the electronic circuit comprising:

a memory having stored therein information describing the transmission frame protocol operated by a system generating a pulsed RF transmission;

a circuit coupled to said memory and adapted to receive as an input a portion of the RF energy in a pulsed RF transmission and output a signal representative of said RF energy, said circuit operating a function for i) determining a peak period for each of a plurality of bits contained in the RF transmission as a function of said protocol, ii) measuring the RF energy contained in each said bit, and iii) computing an average of said RF energy measurements, and iv) generating said output signal representative of RF energy as a function of said average of RF energy measurements.

19. The electronic circuit recited in claim 18, wherein said protocol further comprises a definition of a modulation scheme and burst timing operated the pulsed RF transmission generating system.

20. The electronic circuit recited in claim 19, wherein said memory further comprises a non-volatile memory module.

21. The electronic circuit recited in claim 20, wherein said non-volatile memory module further comprises an erasable programmable read-only memory chip.

22. The electronic circuit recited in claim 18, wherein computing an average of said RF energy measurements further comprises substituting a constant value for said RF energy during periods occurring between measurements of said RF energy contained in said bits.

23. The electronic circuit recited in claim 22, wherein measuring said RF energy contained in said bits further comprises computing an instantaneous power level for each said bit using a Square Root (I*I+Q*Q) formula.

24. The electronic circuit recited in claim 22, further comprising an analog-to-digital converter adapted to receive as an input in analog format said portion of the RF energy in a pulsed RF transmission and coupled to output to said circuit a digital signal representative of said RF energy.

25. The electronic circuit recited in claim 24, further comprising a down-converter adapted to receive as an input said portion of the RF energy in a pulsed RF transmission and coupled to output to said analog-to-digital converter a baseband transmission representative of said RF energy.

26. The electronic circuit recited in claim 25, wherein said baseband transmission further comprises analog In-phase and Quadrature-phase levels corresponding to said transmission frame protocol.

27. The electronic circuit recited in claim 26, wherein said In-phase and Quadrature-phase levels are proportional to respective In-phase and Quadrature-phase levels generated at the pulsed RF transmission source.

28. The electronic circuit recited in claim 24, further comprising a RF coupler adapted both to receive a pulsed RF transmission and to pass a large portion of the energy in a pulsed RF transmission to a transmission line of the system generating the pulsed RF transmission, said RF coupler is further coupled to output a small portion of the energy to said down-converter.

29. The electronic circuit recited in claim 28, wherein said RF coupler further comprises a directional coupler.

30. The electronic circuit recited in claim 28, wherein said RF coupler further comprises a −20 dB directional coupler.

31. The electronic circuit recited in claim 28, further comprising:

a transmission line coupled to said RF coupler; and a source of a pulsed RF transmission coupled to transmit said pulsed RF transmission on said transmission line and coupled to transmit to said down-converter a tuning signal representative of a transmission burst frequency corresponding to a next transmission and to receive said output signal representative of RF energy generated by said circuit.

32. The electronic circuit recited in claim 29, further comprising:

a signal amplifier coupled between said transmission source and said coupler; and a power control circuit coupled between said circuit and said transmission source to receive said output signal of said circuit, said power control circuit generating a power control signal and transmitting said power control signal to said amplifier.

33. The electronic circuit recited in claim 32, further comprising:

a RF receiver;

a RF receiver line coupled receive a RF signal generated external to said transmission source and coupled to said RF receiver;

said circuit coupled to transmit said output signal on said RF receiver line; and a signal splitter coupled to said RF receiver line to receive each of the externally generated RF signal and said circuit output signal, said signal splitter to output the received RF signal to said receiver and said circuit output signal to said power control circuit.

34. The electronic circuit recited in claim 32, further comprising a RF antenna coupled to said RF coupler to accept said energy passed by said coupler and coupled to said RF receiver line to transmit the externally generated RF signal.

35. An electronic circuit for determining the radio frequency power level in a pulsed radio frequency (RF) transmission, the electronic circuit comprising:

a directional coupler adapted to receive a pulsed RF transmission, said coupler directing a first portion of the RF energy in said pulsed RF transmission to a first output and a second portion of the RF energy to a second output;

a down-converter coupled receive the RF energy in one of said first and second outputs of said directional coupler, said down-converter responsively tuned to a tuning signal preceding said pulsed RF transmission and converting said RF energy into an analog baseband signal representative of said RF energy;

an analog-to-digital converter coupled to receive said baseband signal, said analog-to-digital converter converting said analog baseband signal into a digital signal representative of said RF energy; and a computing circuit coupled to receive said digital signal, said computing circuit
  a) determining a peak period for each of one or more bits contained in the pulsed RF transmission,
  b) measuring the RF energy contained in each said bit, and
  c) averaging said RF energy measurements, and
  d) generating an output signal representative of RF energy.

36. The electronic circuit recited in claim 35, wherein said determining a peak period for each of one or more bits contained in the pulsed RF transmission further comprises determining said peak period as a function of the transmission frame protocol operated by the source of the pulsed RF transmission.

37. The electronic circuit recited in claim 36, wherein said generating an output signal representative of RF energy further comprises generating said output signal as a function of said averaging of said RF energy measurements.

38. The electronic circuit recited in claim 37, further comprising a memory coupled to said computing circuit, said memory having stored therein information describing the transmission frame protocol operated by the source of the pulsed RF transmission.

* * * * *